(12) United States Patent
Seddon et al.

(10) Patent No.: US 12,132,005 B2
(45) Date of Patent: Oct. 29, 2024

(54) SUPPORTS FOR THINNED SEMICONDUCTOR SUBSTRATES AND RELATED METHODS

(71) Applicant: SEMICONDUCTOR COMPONENTS INDUSTRIES, LLC, Scottsdale, AZ (US)

(72) Inventors: Michael J. Seddon, Gilbert, AZ (US); Francis J. Carney, Mesa, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 18/507,176

(22) Filed: Nov. 13, 2023

(65) Prior Publication Data

US 2024/0079343 A1  Mar. 7, 2024

Related U.S. Application Data

(63) Continuation of application No. 16/862,270, filed on Apr. 29, 2020, now Pat. No. 11,854,995.

(51) Int. Cl.
  *H01L 23/544* (2006.01)
  *H01L 23/14* (2006.01)
  *H01L 23/32* (2006.01)
  *H01L 25/065* (2023.01)

(52) U.S. Cl.
  CPC .......... *H01L 23/544* (2013.01); *H01L 23/145* (2013.01); *H01L 23/32* (2013.01); *H01L 25/0655* (2013.01)

(58) Field of Classification Search
  CPC ..................................................... H01L 23/544
  USPC ........................................................ 257/618
  See application file for complete search history.

(56) References Cited

U.S. PATENT DOCUMENTS

| | | | |
|---|---|---|---|
| 5,993,292 | A | 11/1999 | Oishi et al. |
| 2005/0104017 | A1 | 5/2005 | Kimba et al. |
| 2006/0046438 | A1 | 3/2006 | Kirby |
| 2006/0231492 | A1 | 10/2006 | Sabottke et al. |
| 2012/0104580 | A1 | 5/2012 | Feng et al. |
| 2013/0210215 | A1 | 8/2013 | Xue et al. |
| 2016/0086838 | A1* | 3/2016 | Santos Rodriguez ....... H01L 21/6835 29/428 |
| 2019/0363057 | A1* | 11/2019 | Santos Rodriguez .. H01L 23/16 |

FOREIGN PATENT DOCUMENTS

| | | |
|---|---|---|
| CN | 102456654 A | 5/2012 |
| JP | 5743410 A | 3/1982 |

* cited by examiner

*Primary Examiner* — Ajay Arora
(74) *Attorney, Agent, or Firm* — Adam R. Stephenson, LTD.

(57) ABSTRACT

Implementations of a semiconductor substrate may include a wafer including a first side and a second side; and a support structure coupled to the wafer at a desired location on the first side, the second side, or both the first side and the second side. The support structure may include an organic compound.

20 Claims, 1 Drawing Sheet

SUPPORTS FOR THINNED SEMICONDUCTOR SUBSTRATES AND RELATED METHODS

CROSS REFERENCE TO RELATED APPLICATIONS

This application is a continuation application of the earlier U.S. Utility Patent Application to Michael J. Seddon entitled "Supports for Thinned Semiconductor Substrates and Related Methods," application Ser. No. 16/862,270, filed Apr. 29, 2020, the disclosure of which is hereby incorporated entirely herein by reference.

BACKGROUND

1. Technical Field

Aspects of this document relate generally to semiconductor packages. More specific implementations involve semiconductor packaged with thinned die.

2. Background

Semiconductor package fabrication processes may involve many steps. In some processes a wafer receives one or more layers, such as electrically conductive layers. Electrically conductive layers may be used to provide electrical contact areas of individual semiconductor devices singulated from the wafer. Further, in some processes the overall size of the semiconductor package may designed to be minimized.

SUMMARY

Implementations of a semiconductor substrate may include a wafer including a first side and a second side; and a support structure coupled to the wafer at a desired location on the first side, the second side, or both the first side and the second side. The support structure may include an organic compound.

Implementations of a semiconductor substrate may include one, all, or any of the following:

The wafer may be not bonded to a carrier.

The support structure may include a wheel and spoke structure.

The support structure may include two or more strips coupled across the wafer.

The support structure may include two or more intersecting strips comprised on the wafer.

The support structure may include one or more structures, each structure including a perimeter including a closed shape.

The support structure may be coupled around one or more semiconductor die, the semiconductor die formed in the wafer.

Implementations of a semiconductor substrate may include a support structure including an organic compound, the support structure coupled to a thinned wafer around an edge of the thinned wafer.

Implementations of semiconductor substrates may include one, all, or any of the following:

The support structure may include a wheel and spoke structure.

The wheel and spoke structure may include at least two spokes.

The support structure may include strips of substantially similar widths.

The support structure may be not coupled to a notch comprised on the thinned wafer.

Implementations of a semiconductor wafer may include a planar semiconductor material including a substantially circular perimeter; and a support structure coupled to the planar semiconductor material adjacent to the substantially circular perimeter. The support structure may include an organic compound.

Implementations of a semiconductor wafer may include one, all, or any of the following:

The planar semiconductor material may be not bonded to a carrier.

The support structure may include varying cross sectional shape along a length of the support structure.

The cross sectional shape may be a closed shape.

The width of the support structure substantially corresponds with a width of an edge exclusion region of the planar semiconductor material.

The support structure may include a cross sectional shape with a highest point along a width of the support structure, the highest point forming a rib.

The semiconductor wafer may include one or more semiconductor die, the one or more semiconductor die formed in the planar semiconductor material, and one or more support structures coupled around one of the one or more semiconductor die.

The support structure may be not coupled to a notch comprised on the planar semiconductor material.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended supports will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such supports, and implementing components and methods, consistent with the intended operation and methods.

Figure 1:
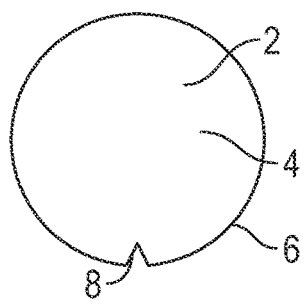
FIG. 1 illustrates an implementation of a semiconductor wafer.

Referring to FIG. 1, an implementation of a thinned semiconductor wafer is illustrated. The wafer includes a planar semiconductor material 2 (wafer) with a largest planar surface, as illustrated. The semiconductor material 2 may include a notch 8, as illustrated. In other implementations, however, the wafer 2 may not include a notch, but may include one or more flats in various implementations. As illustrated, the planar semiconductor material includes a first side 4 and a second side 6 on an opposite side from the first side 4 with a thickness between the first side 4 and the second side 6.

In various implementations, the semiconductor material 2 may include silicon. It is understood that where this disclosure refers to silicon, it could be any type of silicon including by non-limiting example, epitaxial silicon, silicon on insulator, polysilicon, silicon carbide, any combination thereof, or any other silicon-containing substrate material. Further, it is also understood that in various implementations a semiconductor substrate other than a silicon-containing material or substrate may be used, such as, by non-limiting example, gallium arsenide, sapphire, ruby, or any other semiconductor material type. In various implementations, the semiconductor material, or planar semiconductor material, may be thinned from a thickness originally used during processing of the wafer through the various semiconductor process steps used to form semiconductor devices on/in the wafer. In various implementations, the techniques and structure disclosed in this document may be utilized with thin wafers, with no physically separate and eventually separable carrier (wafer carrier) employed to support the thin wafers.

In various implementations, a plurality of semiconductor devices may be partially/fully formed within/on the semiconductor material. In particular implementations, the semiconductor devices may be a plurality of power semiconductor devices including, by non-limiting example, MOSFETs, IGBTs, or any other power semiconductor device. In other implementations, the semiconductor devices may be, by non-limiting examples, image sensors, diodes, transistors, or any other passive or active semiconductor device type.

Figure 2:
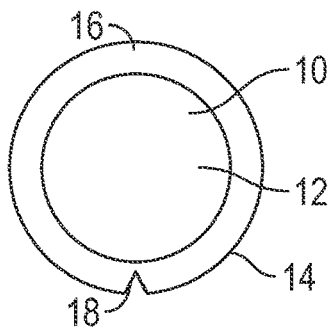
FIG. 2 illustrates an implementation of a semiconductor wafer including a support structure adjacent to a substantially circular perimeter.

Referring to FIG. 2, an implementation of a thinned semiconductor wafer including a support structure coupled to the wafer adjacent to a substantially circular perimeter is illustrated. The support structure 16 is coupled to the wafer or planar semiconductor material 10 (wafer), adjacent to the edge of the wafer. In various implementations, the support structure 16 may be coupled to the planar semiconductor material 10 at a desired location on a first side 12, a second side 14, or both the first side 12 and the second side 14 of the planar semiconductor material 10. In various implementations, the support structure 16 may be coupled at an edge of the planar semiconductor material 10. In various implementations, the support structure 16 may be coupled adjacent to a substantially circular perimeter of the planar semiconductor material 10. The semiconductor material 10 may include a notch 18, as illustrated. In various implementations, the support structure 16 may not be coupled to or over the notch 18. In some implementations, the support structure 16 may include a space or other cut-out region that allows the support structure to not extend over the notch area.

In various support structure implementations disclosed herein, the support structure may have a varying cross sectional shape. In such implementations, the cross sectional shape of the support structure may vary along the length of the structure. This may have the effect in some implementations of creating a support structure that is thicker at particular locations across the cross section of the support structure than at other locations. For example, in the support structure implementation of FIG. 2, the thickest portion of the support structure may be located around the edge of the support structure closest to the edge of the planar semiconductor material (forming a thickened ring). In other implementations, a thickest portion of the support structure may be located around an edge of the support structure closest to the center of the planar semiconductor material (forming a thickened ring). In other implementations, the thickest portion of the support structure may be located substantially in the center of the cross section of the support structure forming a thickened ring around the planar semiconductor material. In all implementations, the cross sectional shape of the support structure may form any closed shape as measured at various locations along the length of the support structure. In various implementations, the cross sectional shape of the support may have a highest point along a width of the support where the highest point forms a rib of material in the support. A wide variety of support structure implementations that employ varying cross sections along the length of the structure may be constructed using the principles disclosed in this document.

In various implementations, in an implementation of a method of manufacturing a support structure on a thinned planar semiconductor substrate material (wafer), following formation of one or more semiconductor devices on/in the wafer, a second side of the wafer opposite the side where the device are located is thinned through, by non-limiting example, back grinding, grinding, polishing, lapping, any combination thereof, and any other method for thinning a semiconductor substrate. A support material is then applied to the first side of the semiconductor substrate around a perimeter or other location on the substrate. In particular implementations, the support material may be an organic compound or a mold compound which is applied and cured into a support structure 16, as illustrated. The organic compound may be may be, by non-limiting example, a polymer, an epoxy, a resin, a mold compound, an encapsulant, or any other carbon containing material. The mold compound may include, by non-limiting example, an epoxy, acrylic, resin, filler, pigment, additive, any combination thereof, or any other type of mold compound or protective covering capable of hardening and providing physical support to a semiconductor substrate. The mold compound may be applied using, by non-limiting example, a liquid dispensing technique, a transfer molding technique, a vacuum molding technique, a glob top molding technique, a compression molding technique, or any other method of applying a polymeric material to the end of a semiconductor substrate. In other implementations the material may be, by non-limiting example, a polyimide, a polymer, a tape, an adhesive tape, a film, a metal foil, a thick-film photoresist, or any other material capable of forming a layer on the semiconductor substrate to provide support sufficient for handling in subsequent packaging processing steps.

Figure 3:
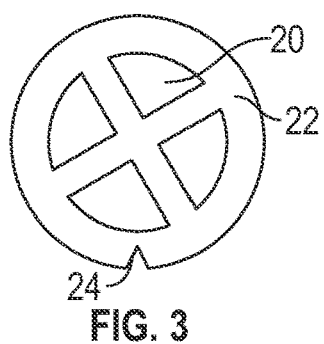
FIG. 3 illustrates an implementation of a semiconductor wafer including a support structure with a wheel and spoke structure.

Referring to FIG. 3, an implementation of a thinned semiconductor wafer including a support structure with a wheel and spoke structure is illustrated. The support structure 22 is coupled to wafer or planar semiconductor material 20, as illustrated. As illustrated, the support structure 22 forms a wheel and spoke shape on the semiconductor material 20 with four spokes. In other implementations however three or more spokes may be employed. Also, while a central hub through which all of the spokes is illustrated in the implementation of FIG. 3, in other implementations, the central hub may be omitted and the spokes may not be joined together, but only couple to the wheel portion of the support structure. The semiconductor material 20 may include a notch 24, which is not be coupled to the notch 24 as illustrate. In various implementations, the support structure 22 may include a mold compound like any disclosed in this document or may be any other material type disclosed in this document.

Figure 4:
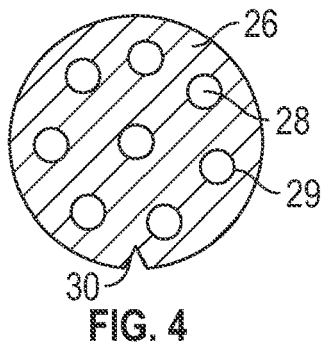
FIG. 4 illustrates an implementation of a semiconductor wafer including a support structure.

Referring to FIG. 4, an implementation of a thinned semiconductor wafer including a support structure is illustrated. The support structure 26 is coupled to a wafer or planar semiconductor material 28, as illustrated. As illustrated, the support structure 26 couples over a majority of the largest planar surface of the planar semiconductor material 28, excluding those regions/openings formed by one or more closed shapes 29. The perimeters of the closed shapes 29 may form circular shapes, as illustrated, though in other implementations, the perimeters of the closed shapes 29 may form, by non-limiting example, rectangular shapes, triangular shapes, polygons, or any other closed shape. As illustrated, the planar semiconductor material 28 may include a notch 30. In various implementations, the support structure 26 may not be coupled to the notch 30. In various implementations, the support structure 26 may include a mold compound which may be any disclosed in this document or may be any other material type disclosed in this document.

Figure 5:
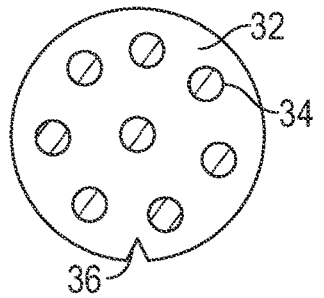
FIG. 5 illustrates an implementation of a semiconductor wafer including a support structure with a plurality of support structures.

Referring to FIG. 5, an implementation of a thinned semiconductor wafer including a support structure with a plurality of separate structures is illustrated. The support structure 34 is coupled to a planar semiconductor material 32 or semiconductor wafer, as illustrated. As illustrated, the support structure 34 is made of one or more separate structures, each structure having a perimeter that defines or forms a closed shape. As illustrated various implementations, the one or more structures of the support structure 34 do not intersect or touch one another. However, in some implementations the structures may be adjacent to, or may come in contact with one another. The various separate structure may work to provide sufficient localized support that when arranged in a pattern, the semiconductor material 32 is sufficiently strong to undergo subsequent packaging operations. The semiconductor material 32 may also include a notch 36, as illustrated. In various implementations, the various separate structures of the support structure 34 may not be coupled to the notch 36. In various implementations, the support structure 34 may be made of a mold compound which may be any mold compound disclosed in this document or may be made of any other material disclosed in this document.

Figure 6:
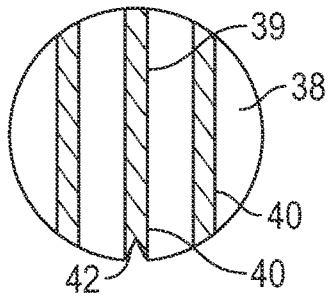
FIG. 6 illustrates an implementation of a semiconductor wafer including a support structure with strips coupled across the semiconductor wafer.

Referring to FIG. 6, an implementation of a thinned semiconductor wafer including a support structure composed of strips coupled across the semiconductor wafer is illustrated. The support structure 39 is coupled to the largest planar surface of a wafer or a planar semiconductor material 38, as illustrated. As illustrated, the support structure 39 includes two or more strips 40 coupled across the largest planar surface. In various implementations, the strips may be oriented in any direction relative to a notch or flat of the wafer; they may be, by non-limiting example, parallel to one another, angled relative to each other but not intersecting, extend completely across the largest planar surface, extend only partially across the largest planar surface, any combination thereof, or otherwise oriented on the planar semiconductor material. The semiconductor material 38 may include a notch 42 and the support structure 39 may not be coupled to the notch 42. In various implementations, the support structure 39 may be made of a mold compound like any disclose herein or made of any material disclosed herein for support structures.

Figure 7:
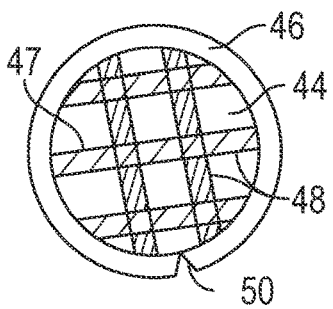
FIG. 7 illustrates an implementation of a semiconductor wafer including a support structure with intersecting strips.

Referring to FIG. 7, an implementation of a thinned semiconductor wafer including a support structure that includes intersecting strips is illustrated. The support structure 47 is coupled to the largest planar surface of a planar semiconductor material 44 or semiconductor wafer. As illustrated, the support structure 47 may be formed from two or more intersecting strips 48 arranged across the semiconductor material 44. In various implementations, a width of the support structure 47 (i.e., the distance between the ends of the two or more intersecting strips and the edge of the semiconductor material) substantially corresponds with a width of an optical edge exclusion region/optical edge bead removal (OEBR) region 46 of the planar semiconductor material 44, as illustrated. In other various implementations, the support structure 47 may be coupled all the way to the edge of the planar semiconductor material. The semiconductor material 44 may include a notch 50, as illustrated. In various implementations, the support structure 47 may not be coupled to the notch 50. In various implementations, the curvature support structure 47 may include a mold compound which may be any disclosed in this document or any other material disclosed in this document used for support structures.

Figure 8:
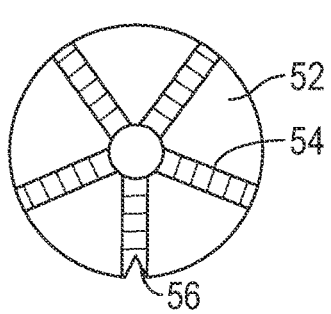
FIG. 8 illustrates an implementation of a semiconductor wafer including a support structure with a spoke structure.

Referring to FIG. 8, an implementation of a thinned semiconductor wafer including a support structure with a spoke structure without a central hub is illustrated. The support structure 54 is coupled to a largest planar surface of a wafer or planar semiconductor material (wafer) 52. As illustrated, the support structure 54 form a spoke structure on the semiconductor material 52 where the spokes are arranged a central opening that is an opening in the material itself. In this implementation, the spokes just contact one another around the opening. In other implementations, however, the spokes may not contact one another. As illustrated, the spoke structure includes five spokes, though in various implementations three or more spokes may be employed. In the implementation illustrated the spokes extend to the edge of the wafer 52, but in others, they may extend only to any of the previously discussed exclusion regions as in the implementation illustrated in FIG. 7. The semiconductor material 52 may include a notch 56, as illustrated. In various implementations, the support structure 54 may not be coupled to the notch 56 but may be coupled around it. In various implementations, the support structure 54 may include a mold compound like any disclosed in this document or may be any other material disclosed in this document used for support structures.

Figure 9:
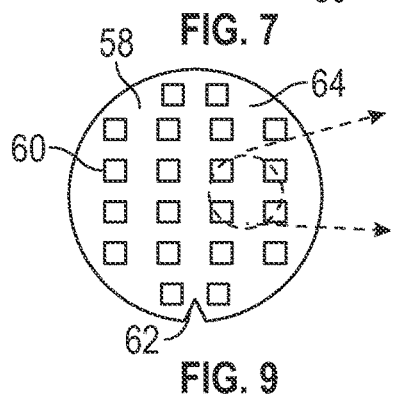
FIG. 9 illustrates an implementation of a semiconductor wafer including a support structure coupled around semiconductor die.

Referring to FIG. 9, an implementation of a thinned semiconductor wafer including a plurality of support structures coupled around semiconductor die is illustrated. The support structure 58 is coupled to a largest planar surface of each of a plurality of die included in the wafer or planar semiconductor material 64, as illustrated. As illustrated, the support structure 58 is coupled around a perimeter of the semiconductor die 60 formed in the planar semiconductor material 64, as illustrated. In some implementations, the support structure 58 material completely covers the largest planar surface of each die; in others, only a portion of the largest planar surface of each die may be covered. Collectively, the plurality of support structures may provide sufficient support to the material of the semiconductor wafer 64 to allow it, when thinned, to be able to be processed through subsequent packaging operations. The semiconductor material 64 may include a notch 62 and because the support structure 58 is coupled around the die, the support structure is not coupled around the notch 62. In various implementations, the support structure 58 may include a mold compound like any disclosed herein or any other material disclosed herein used for support structures 58.

Figure 10:
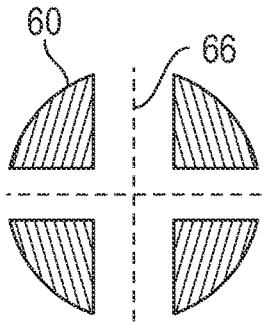
FIG. 10 illustrates a magnified view of the implementation of a semiconductor wafer of FIG. 9.

Referring to FIG. 10, a magnified view of an intersection between four die 60 at intersecting die streets 66 from the implementation of a semiconductor wafer of FIG. 9 is illustrated. As illustrated, the die streets 66 do not include the material of the support structure 58 itself. However, in other implementations, the material of the support structure 58 may extend over a portion of the die streets 66. In this way, the support structure 58 may act to collectively provide the support needed for the wafer to undergo subsequent packaging operations.

Figure 11:
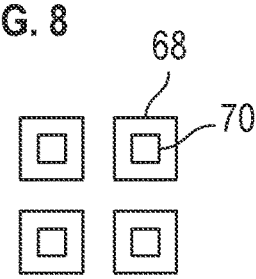
FIG. 11 illustrates a plurality of singulated semiconductor die.

Referring to FIG. 11, a plurality of thinned singulated semiconductor die from the wafer with support that is coupled over a largest planar surface of each die is illustrated like those illustrated in FIGS. 9 and 10. In various implementations, after the die 70 are separated, or singulated, a portion of the support structure 68 may remain coupled around each die 70. This portion may remain whether the support structure 68 ends at the die street or encroaches on a portion of the die street. After singulation, the semiconductor die may be used in various packaging systems or devices, in various implementations. Because of the presence of the remaining support structure, the die themselves may be strengthened during subsequent die packaging operations.

In various implementations, the support structure may be applied prior to or after thinning of the wafer/semiconductor material. In various implementations, at the time the support structure is applied, it may be applied in its entirety, or may be applied in portions. In various implementations, the various support structures disclosed herein may include one or more layers of material. In these implementations, the one or more layers may include different types or the same types of material. In some implementations, one of the one or more layers of material may be temporarily applied, being removable from the other layers of material at a particular part of subsequent packaging steps. Any of a wide variety of method implementations of a method of forming a support structure on a semiconductor substrate/wafer may be employed in various implementations.

In places where the description above refers to particular implementations of supports and implementing components, sub-components, methods and sub-methods, it should be readily apparent that a number of modifications may be made without departing from the spirit thereof and that these implementations, implementing components, sub-components, methods and sub-methods may be applied to other supports.

What is claimed is:

1. A semiconductor substrate comprising:
a wafer comprising a first side and a second side; and
a support structure separate from a material of the wafer coupled to the wafer at a desired location on the first side, the second side, or both the first side and the second side;
wherein the wafer is undiced;
wherein the support structure comprises an organic compound; and
wherein the support structure comprises a plurality of openings therein.

2. The semiconductor substrate of claim 1, wherein the wafer is not bonded to a carrier.

3. The semiconductor substrate of claim 1, wherein each opening of the plurality of openings comprises a perimeter having a closed shape.

4. The semiconductor substrate of claim 3, wherein the closed shape is circular.

5. The semiconductor substrate of claim 1, wherein the support structure comprises two or more strips coupled across the wafer.

6. The semiconductor substrate of claim 1, wherein the support structure comprises a plurality of intersecting strips comprised on the wafer.

7. The semiconductor substrate of claim 6, wherein the plurality of openings are comprised between the plurality of intersecting strips.

8. The semiconductor substrate of claim 1, wherein the wafer is exposed through the plurality of openings.

9. A semiconductor substrate comprising:
a uniformly thinned wafer comprising a first side and a second side; and
a support structure separate from a material of the uniformly thinned wafer coupled to the uniformly thinned wafer at a desired location on the first side, the second side, or both the first side and the second side;
wherein the wafer is undiced;
wherein the support structure comprises an organic compound; and
wherein the support structure comprises a plurality of strips extending across the uniformly thinned wafer; and
wherein the support structure comprises a plurality of non-contiguous openings between the plurality of strips.

10. The semiconductor substrate of claim 9, wherein the plurality of strips comprise three or more substantially parallel strips.

11. The semiconductor substrate of claim 9, wherein the plurality of strips are intersecting.

12. The semiconductor substrate of claim 9, wherein the plurality of strips extend across an entire width of the uniformly thinned wafer.

13. The semiconductor substrate of claim 9, wherein the plurality of strips are angled relative to one another.

14. The semiconductor substrate of claim 9, wherein the plurality of strips extend across only a portion of a width of the uniformly thinned wafer.

15. The semiconductor substrate of claim 9, wherein the uniformly thinned wafer comprises a notch exposed between the plurality of strips.

16. A semiconductor substrate comprising:
a uniformly thinned wafer comprising a first side and a second side; and
a support structure separate from a material of the uniformly thinned wafer coupled to the uniformly thinned wafer at a desired location on the first side, the second side, or both the first side and the second side;
wherein the wafer is undiced;
wherein the support structure comprises an organic compound; and
wherein the support structure comprises a plurality of intersecting strips extending across the uniformly thinned wafer.

17. The semiconductor substrate of claim 16, wherein the plurality of intersecting strips form a plurality of substantially rectangular openings through the support structure.

18. The semiconductor substrate of claim 16, further comprising an edge exclusion region, wherein the plurality of intersecting strips extend to an inner perimeter of the edge exclusion region.

19. The semiconductor substrate of claim 16, wherein the plurality of intersecting strips extend across an entire width of the uniformly thinned wafer.

20. The semiconductor substrate of claim 16, wherein the plurality of intersecting strips comprise at least three substantially parallel strips.

* * * * *